(12) United States Patent
Chao (10) Patent No.: US 8,890,548 B2
(45) Date of Patent: Nov. 18, 2014

(54) COMPENSATING CIRCUIT HAVING PROGRAMMABLE CAPACITANCE ARRAY FOR MEASURING AC VOLTAGE

(75) Inventor: Po Yin Chao, Taipei (TW)

(73) Assignee: Hycon Technology Corp., Taipei (TW)

( * ) Notice: Subject to any disclaimer, the term of this patent is extended or adjusted under 35 U.S.C. 154(b) by 126 days.

(21) Appl. No.: 13/589,213

(22) Filed: Aug. 20, 2012

(65) Prior Publication Data

US 2014/0049275 A1    Feb. 20, 2014

(51) Int. Cl.
*G01R 27/32* (2006.01)

(52) U.S. Cl.
USPC ........................................... 324/684

(58) Field of Classification Search
USPC ............ 324/679–687, 600, 720–724, 754.11, 324/669
See application file for complete search history.

(56) References Cited

U.S. PATENT DOCUMENTS

2011/0163766 A1 *   7/2011   Geaghan ..................... 324/678

* cited by examiner

*Primary Examiner* — Patrick Assouad
*Assistant Examiner* — Trung Nguyen
(74) *Attorney, Agent, or Firm* — Che-Yang Chen; Law Office of Michael Chen (57) ABSTRACT

A compensating circuit which has a programmable capacitance array for measuring AC voltage is disclosed in the present invention. The compensating circuit includes a pair of first leads for linking to an AC circuit; a variable capacitor, electrically linked to the first leads, for providing different capacitance value according to a programmable capacitance array; and a control unit, electrically linked to the first leads, for changing the capacitance value of the variable capacitor as one capacitance of the programmable capacitance array according to an external instruction. Since the capacitance of the compensating circuit is changeable, and AC voltage meter designed with the compensating circuit is able to measure voltage in wider range of frequency.

5 Claims, 8 Drawing Sheets

```
BIT6–BIT0
C000: 0000000
C001: 0000001
C002: 0000010
C003: 0000011
       ⋮
C127: 1111111
```

Fig. 5

| n | $2^n$ | Unit Capacitance (pF) | Capacitance c | ACC[n] | BIT0/1 |
|---|---|---|---|---|---|
| 0 | 1 | 0.2 | 0.0 | ACC0 | 1 |
| 1 | 2 | 0.2 | 0.4 | ACC1 | 0 |
| 2 | 4 | 0.2 | 1.6 | ACC2 | 1 |
| 3 | 8 | 0.2 | 4.8 | ACC3 | 0 |
| 4 | 16 | 0.2 | 12.8 | ACC4 | 1 |
| 5 | 32 | 0.2 | 32.0 | ACC5 | 0 |
| 6 | 64 | 0.2 | 76.8 | ACC6 | 1 |
|   |   |   | Total Capacitance (pF) |   | 91.2 |

Fig. 6

COMPENSATING CIRCUIT HAVING PROGRAMMABLE CAPACITANCE ARRAY FOR MEASURING AC VOLTAGE

FIELD OF THE INVENTION

The present invention relates to a compensating circuit. More particularly, the present invention relates to compensating circuit which has a programmable capacitance array for measuring AC voltage.

BACKGROUND OF THE INVENTION

AC voltage meter is a very commonly used device in daily life. Traditionally, AC voltage meter uses a resistor divider with large resistance and includes several capacitors. Naturally, the AC voltage meter becomes a low-pass filter. For an AC source with frequency higher than 500 Hz, it is hard to perform precise measurement due to the decrease of signal strength.

Figure 1A:
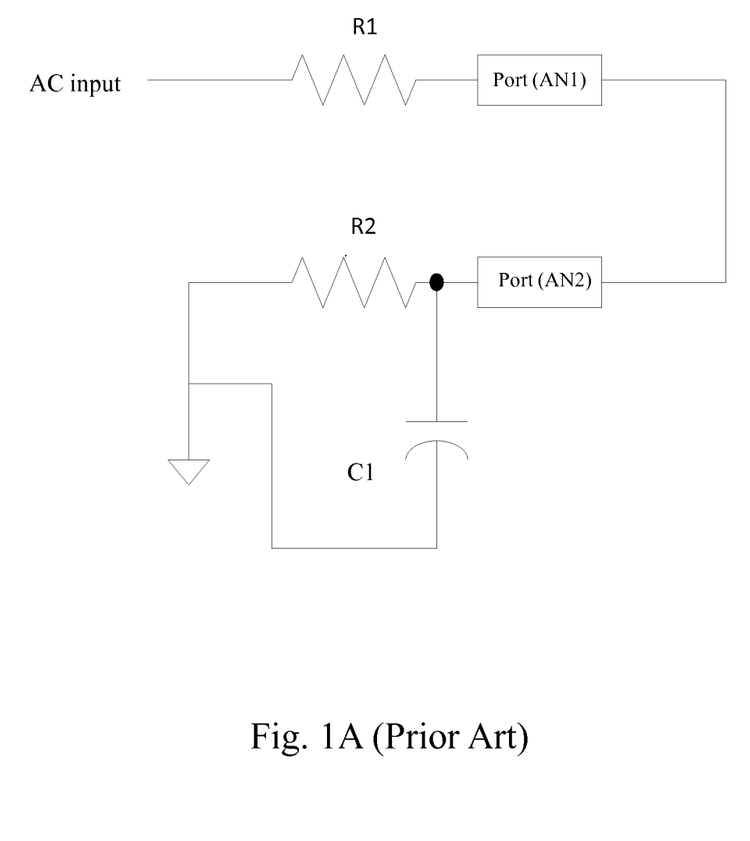
FIG. 1A shows a prior art of an AC voltage meter.
Figure 1B:
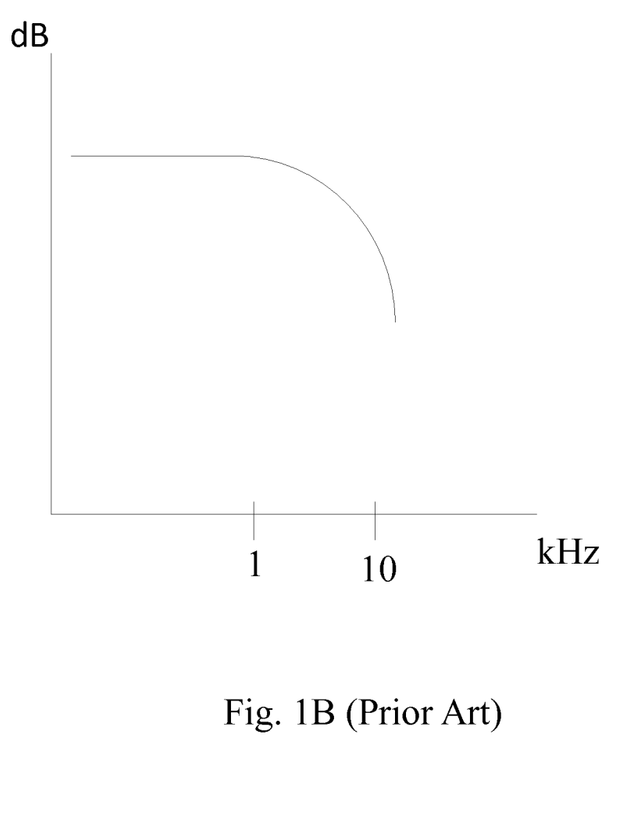
FIG. 1B is a signal strength vs. frequency relation of the AC voltage meter of the prior art.

Please refer to FIG. 1A and FIG. 1B. FIG. 1A shows a traditional design of an AC voltage meter which includes two resistors R1 and R2 for use as a resistor divider, and a capacitor C1 to form a detecting unit to obtain the AC voltage for further measurement. FIG. 1B shows how the signal strength changes along with frequency of an AC voltage source. It is obvious that the signal strength drops after 1 kHz. When the frequency is over 10 kHz, the AC voltage meter is hard to use for AC voltage measurement.

Figure 2A:
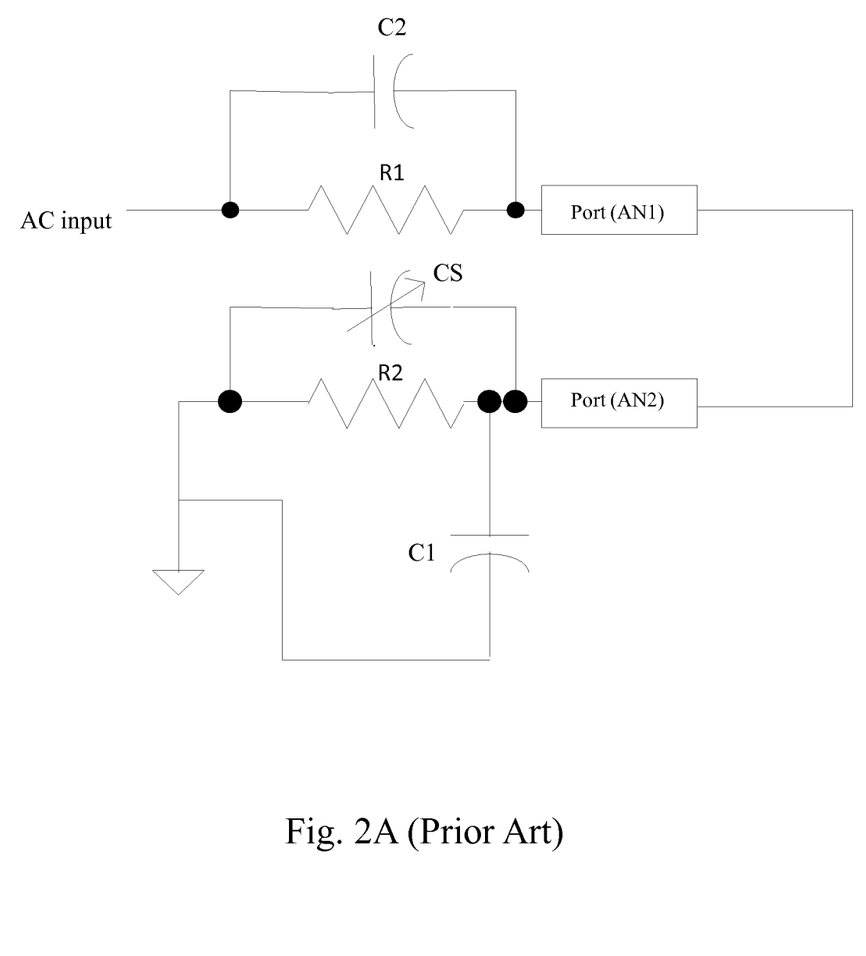
FIG. 2A shows a prior art of another AC voltage meter.
Figure 2B:
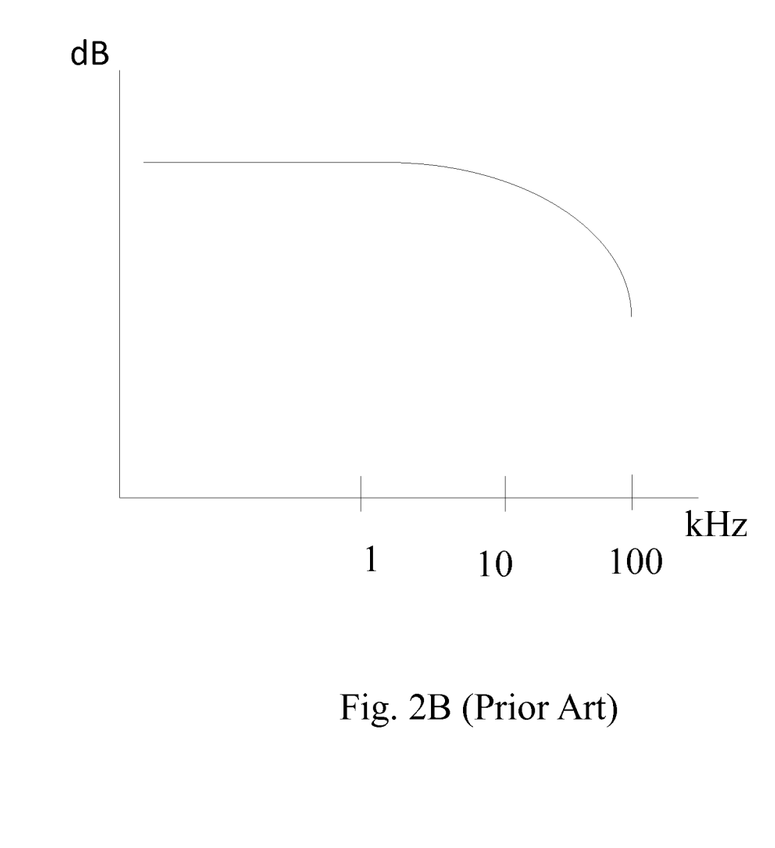
FIG. 2B is a signal strength vs. frequency relation of the AC voltage meter of another prior art.

For some higher end AC voltage meters, the detecting unit would be finely designed to mitigate the situation mentioned above. Please refer to FIG. 2A and FIG. 2B. Two capacitors C2 and Cs are used, wherein the capacitor Cs is a variable capacitor. Thus, such design can be able to measure AC voltage sources with wider frequencies.

Conventionally, a method of compensating frequency to achieve the variable capacitor corresponding to different frequencies of AC voltage sources is to change external capacitors of the AC voltage meter manually. However, when capacitors are changed by welding, there will be excess solder residue. The capacitance values could easily lead to instability due to reasons such as temperature and humidity. Capacitance of the external capacitors will also be affected by different batches of PCB with different correction values. If the AC voltage meter needs a final tuning by production labors after it is assembled, its cost increases and precision drops.

European Patent Publication No. EP 2,386,868 thought of to overcome such problem by applying a known voltage signal across a first and second inputs to a capacitive divider circuit; measuring a voltage across a first and second plates of a third capacitor; determining a transfer function that would be operative to change the measured voltage; configuring the compensator circuit with the determined transfer function; and measuring a high voltage AC signal with the voltage measurement circuit, such that the compensator circuit is operative to change a voltage received at its input in accordance with the determined transfer function and to provide the changed voltage at its output.

Although the transfer function and compensator circuit can be used to obtain a more precise measuring result of a high AC voltage, it can not be applied to smaller range of voltages.

Therefore, an AC voltage meter which is able to measure voltages in a large range of frequencies is desperately desired.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In accordance with an aspect of the present invention, a compensating circuit, comprises: a pair of first leads for linking to an AC circuit; a variable capacitor, electrically linked to the first leads, for providing different capacitance value according to a programmable capacitance array; and a control unit, electrically linked to the first leads, for changing the capacitance value of the variable capacitor as one capacitance of the programmable capacitance array according to an external instruction.

Preferably, the control unit further comprises a pair of second leads, for receiving the external instruction.

Preferably, the external instruction is provided from a software in a laptop or desktop.

Preferably, the programmable capacitance array provides different capacitance values equaling to $$\sum_{n=0}^{m} ACC[n] \times 2^n \times (Cap),$$

wherein the ACC[n] is a BIT array, comprising a number of 0 and 1, the m is a parameter, the n is a recursive parameter, the Cap is a unit capacitance, and a unit of the capacitance value is pico-farad (pF).

Preferably, the unit capacitance, Cap, is different in different wafer fabrication.

Preferably, the unit capacitance, Cap, is 0.2.

DETAILED DESCRIPTION OF THE PREFERRED EMBODIMENT

The present invention will now be described more specifically with reference to the following embodiment. It is to be noted that the following descriptions of preferred embodiment of this invention are presented herein for purpose of illumination and description only; it is not intended to be exhaustive or to be limited to the precise form disclosed.

Figure 3:
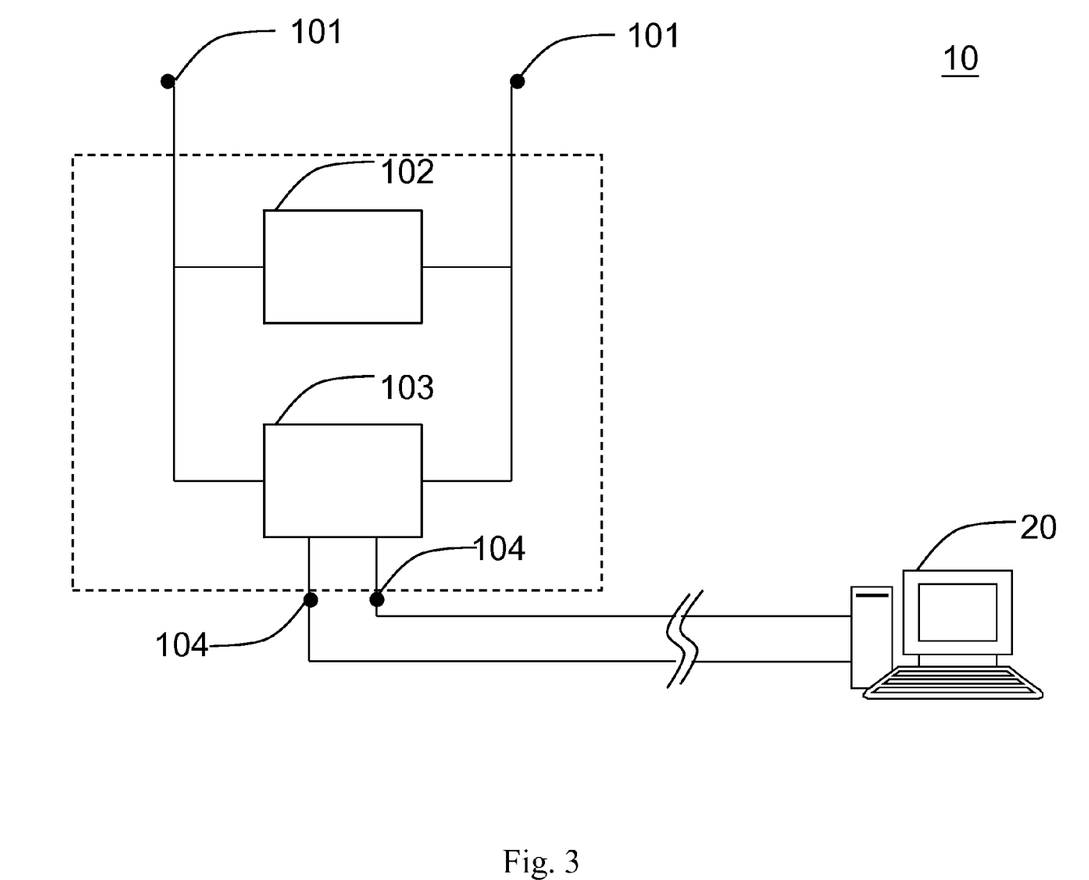
FIG. 3 shows an embodiment of the present invention.
Figure 4:
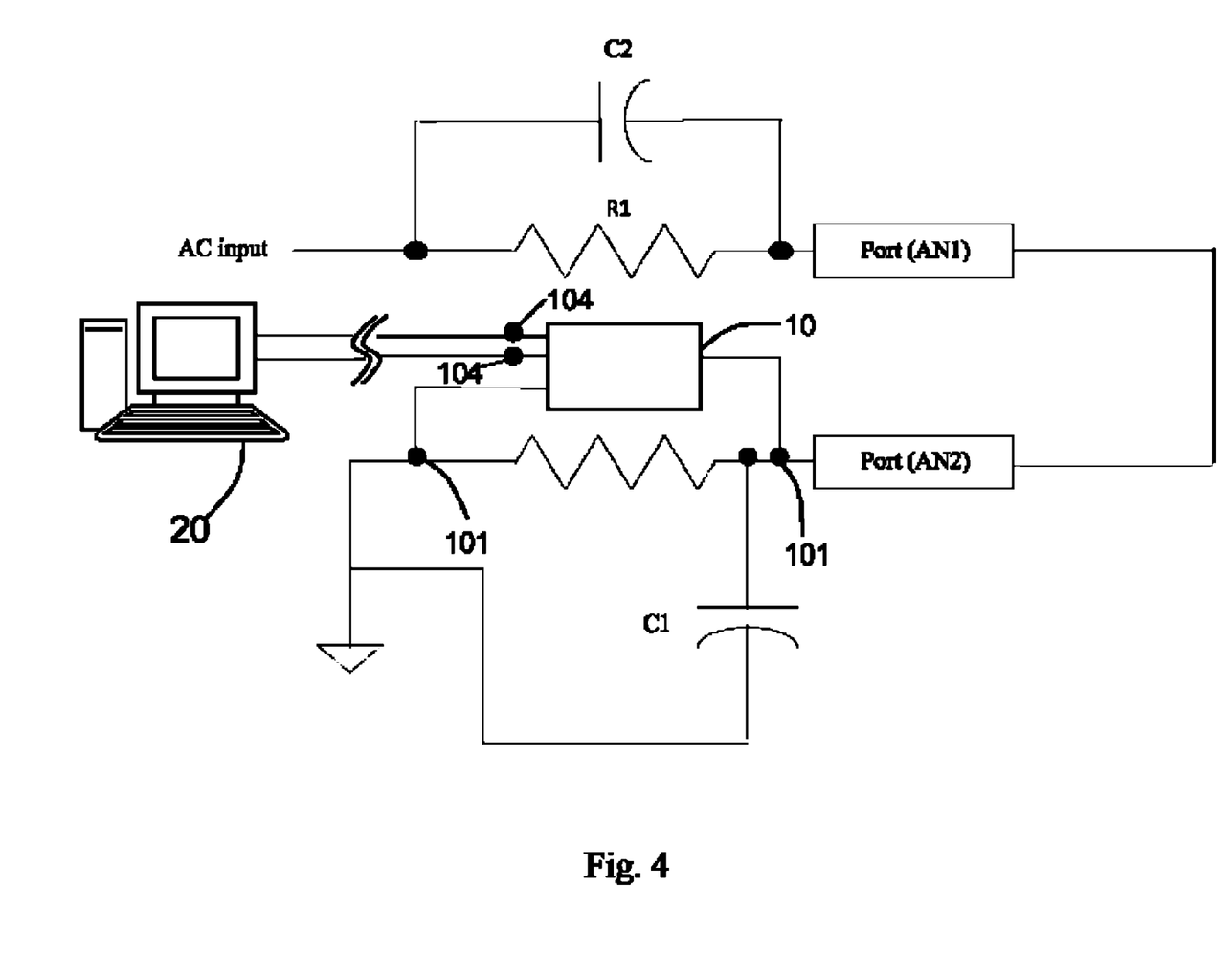
FIG. 4 illustrates how the embodiment is applied to an AC voltage meter.
Figure 5:
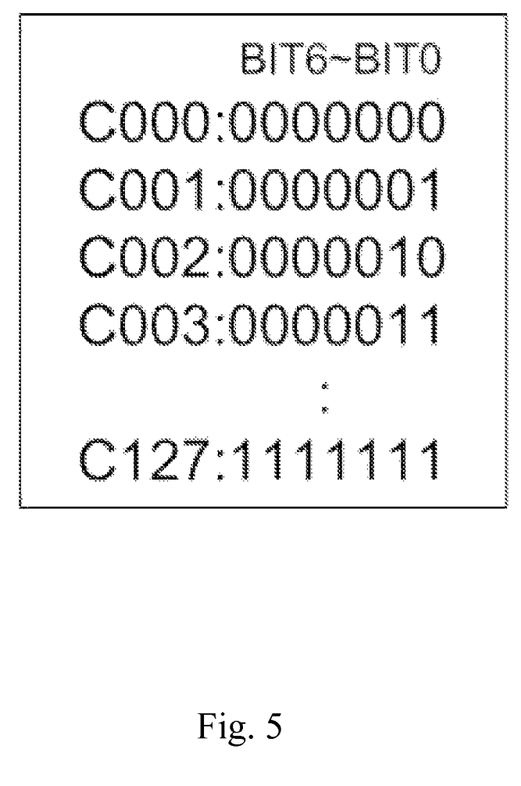
FIG. 5 shows the structure of a BIT array.
Figure 6:
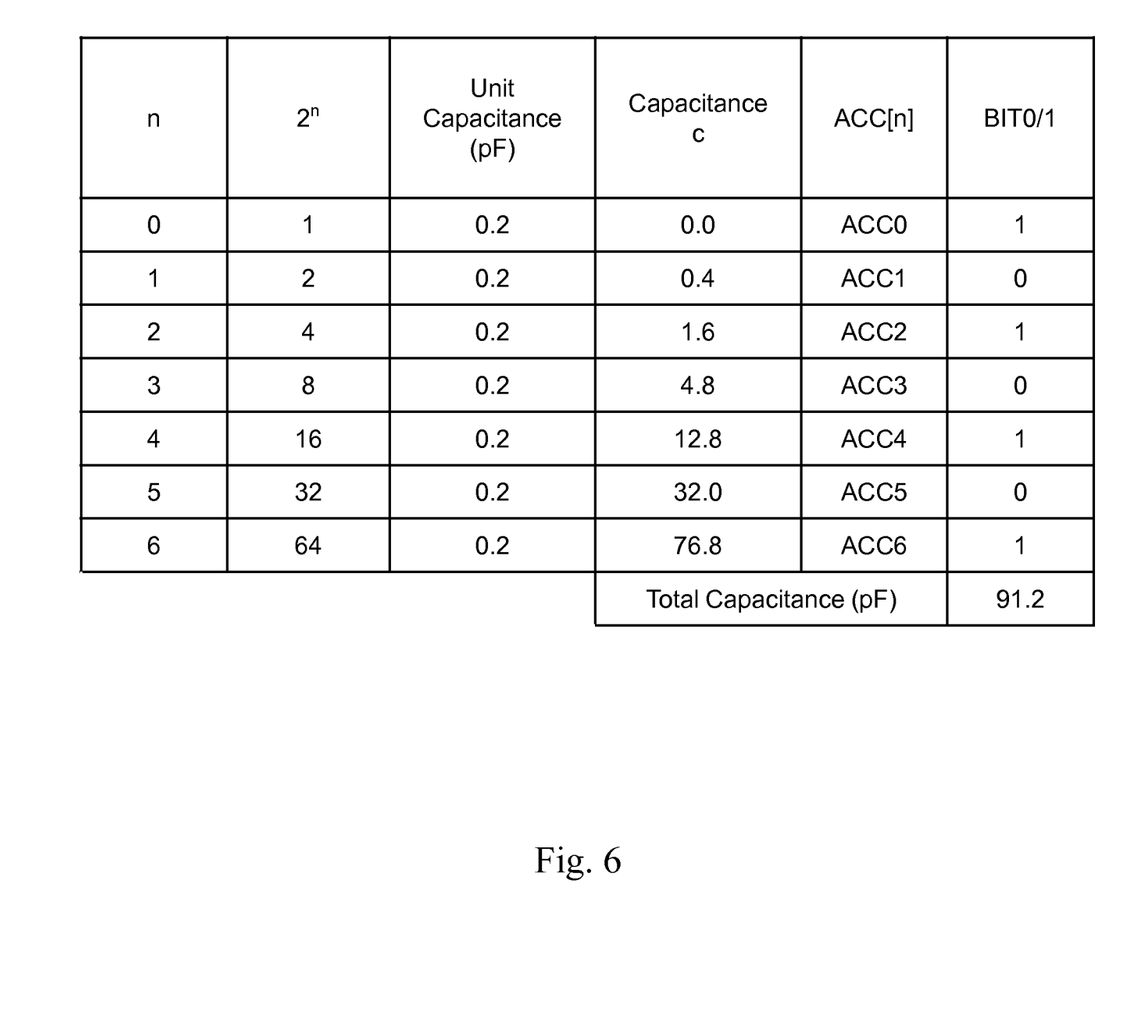
FIG. 6 lists processes of operating a capacitance according to the present invention.

An embodiment of the present invention is illustrated in FIGS. 3 to 6. FIG. 3 shows an embodiment of the present invention. FIG. 4 illustrates how the embodiment is applied to an AC voltage meter. FIG. 5 shows the structure of a programmable capacitance array. FIG. 6 lists processes of operating a capacitance according to the present invention.

Please refer to FIG. 3. According to the present embodiment, a compensating circuit 10 includes a pair of first leads 101, a variable capacitor 102, a control unit 103, and a pair of second leads 104. The first leads 101 are used for linking to an AC circuit (not shown). It is should be emphasized that the linkage between the first leads 101 and the AC circuit can be direct or indirect. The direct way is to contact the AC circuit without any other component, such as a resistor, in between. Otherwise, according to the spirit of the present invention, there can be other components between the first leads 101 and the AC circuit.

The variable capacitor 102 is electrically linked to the first leads 101. It can provide different capacitance value according to a programmable capacitance array. The control unit 103 is electrically linked to the first leads 101. It is used for changing the capacitance value of the variable capacitor as one capacitance of the programmable capacitance array according to an external instruction. The second leads 104 can receive the external instruction from outside. It should be noticed that the external instruction is provided from a software in a laptop or desktop. In this embodiment, the software is install in a desktop 20 by which users can commend the control unit 103 to have different capacitance value from the variable capacitor 102. If possible, the elements enclosed by dash-line can be manufactured in to an integrated circuit (IC) for application of modulation.

Before a detailed description of operation of the compensating circuit 10 is disclosed, please refer to FIG. 4. It illustrates how the compensating circuit 10 is applied to the example in FIG. 2A. Take all the components in FIG. 2A except the replaced capacitor, Cs into FIG. 4. People can easily understand that the compensating circuit 10 is just linked to the existing AC voltage meter via the first leads 101 and uses the second leads 104 to receive commend from the desktop 20. Otherwise, the compensating circuit 10 plays a role exactly the same as the variable capacitor Cs in FIG. 2A.

Please refer to FIG. 5 and FIG. 6. The programmable capacitance array provides different capacitance values equaling to the equation of $$\sum_{n=0}^{m} ACC[n] \times 2^n \times (Cap).$$

The n is a recursive parameter. It is used to describe a mathematical calculation status when different value runs. The ACC[n] is a BIT array. It comprises a number of 0 and 1 as shown in FIG. 5. From n equals to 0 to 6, the BIT changes. Therefore, each ACC[n] can be one of 0X0000000 to 0X1111111. Total $2^7$, 128 arrays can be used to obtain different capacitance value. The m is a parameter. In this embodiment, m is 6. The Cap is a unit capacitance. 0.2 is preferable in practice. According to the spirit of the present invention, the unit capacitance, Cap, is different in different wafer fabrication. It is not limited to 0.2. Unit of the capacitance value is pico-farad (pF) according to the present embodiment.

Please refer to FIG. 6. It lists processes of operating a capacitance in a table. When a user uses the desktop 20 to give a commend to the compensating circuit 10, it is very easy for him to pick up one array out of the ACC[n] from the screen and send the decision to the control unit 103, a capacitance value is obtained. ACC[n] is picked up as 0X1010101. Sum of the operation is 91.2. It is 91.2 pF provided by the compensating circuit 10.

It is understood that the application of the present invention is using digital programmable array of capacitors in a chipset. Users use the software through the desktop, laptop or other device with click on the screen to accurately fine-tune the value of the compensation capacitors. It has advantage to be free from shortcomings which are caused by manually replacing the external capacitors.

While the invention has been described in terms of what is presently considered to be the most practical and preferred embodiment, it is understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A compensating circuit, comprising:
a pair of first leads for linking to an AC circuit;
a variable capacitor, electrically linked to the first leads, for providing different capacitance value according to a programmable capacitance array; and
a control unit, electrically linked to the first leads, for changing the capacitance value of the variable capacitor as one capacitance of the programmable capacitance array according to an external instruction,
wherein the programmable capacitance array provides different capacitance values equaling to $$\sum_{n=0}^{m} ACC[n] \times 2^n \times (Cap),$$

wherein the ACC[n] is a BIT array, comprising a number of 0 and 1, the m is a parameter, the n is a recursive parameter, the Cap is a unit capacitance, and a unit of the capacitance value is pico-farad (pF).

2. The compensating circuit according to claim 1, wherein the control unit further comprises a pair of second leads, for receiving the external instruction.

3. The compensating circuit according to claim 1, wherein the external instruction is provided from a software in a laptop or desktop.

4. The compensating circuit according to claim 1, wherein the unit capacitance, Cap, is different in different wafer fabrication.

5. The compensating circuit according to claim 1, wherein the unit capacitance, Cap, is 0.2.

\* \* \* \* \*